(12) United States Patent
Anderson et al.

(10) Patent No.: US 7,929,117 B2
(45) Date of Patent: Apr. 19, 2011

(54) APPARATUS FOR REAL-TIME CONTAMINATION, ENVIRONMENTAL, OR PHYSICAL MONITORING OF A PHOTOMASK

(75) Inventors: Brent A. Anderson, Jericho, VT (US);
Robert K. Leidy, Burlington, VT (US);
Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 475 days.

(21) Appl. No.: 12/056,047

(22) Filed: Mar. 26, 2008

(65) Prior Publication Data
US 2009/0244501 A1  Oct. 1, 2009

(51) Int. Cl.
*G03B 27/62* (2006.01)
*G03B 27/52* (2006.01)

(52) U.S. Cl. .......................................... 355/75; 355/30

(58) Field of Classification Search .................... 355/75, 355/53, 30
See application file for complete search history.

(56) References Cited

U.S. PATENT DOCUMENTS

| | | | |
|---|---|---|---|
| 5,581,324 A * | 12/1996 | Miyai et al. ..................... | 355/53 |
| 6,312,859 B1 | 11/2001 | Taniguchi | |
| 6,509,956 B2 | 1/2003 | Kobayashi | |
| 6,653,024 B1 | 11/2003 | Shiraishi et al. | |
| 6,809,793 B1 * | 10/2004 | Phan et al. ..................... | 355/30 |
| 6,813,004 B1 | 11/2004 | Horikoshi et al. | |
| 6,993,405 B2 | 1/2006 | Beaulieu et al. | |
| 7,196,771 B2 | 3/2007 | Berger | |
| 2007/0099099 A1 * | 5/2007 | Onvlee et al. .................. | 430/30 |

FOREIGN PATENT DOCUMENTS

JP 2006133411 A 5/2006
* cited by examiner

*Primary Examiner* — Peter B Kim
(74) *Attorney, Agent, or Firm* — Wood, Herron & Evans, LLP

(57) ABSTRACT

An apparatus for real-time contamination, environmental, or physical monitoring of a photomask. The apparatus includes a photomask having a patterned region configured to correspond to features of an integrated circuit and a sensor physically coupled with the photomask. The sensor is configured to monitor an attribute related to the photomask. Attributes monitored by the sensor may include chemical contamination, temperature changes, humidity changes, acceleration, shock, vibration, optical flux through the photomask, electrostatic discharge environment of the photomask, particulates, and pressure.

4 Claims, 1 Drawing Sheet

APPARATUS FOR REAL-TIME CONTAMINATION, ENVIRONMENTAL, OR PHYSICAL MONITORING OF A PHOTOMASK

FIELD OF THE INVENTION

The invention relates generally to integrated circuit fabrication and, in particular, to photomasks used to fabricate integrated circuits.

BACKGROUND OF THE INVENTION

In the semiconductor industry, integrated circuits are made using photolithographic processes that rely upon a series of different photomasks to define different structural features of the circuit. The pattern on each photomask is designed to conform to dimensional rules that ensure that the patterns transfer properly and the integrated circuit functions properly. Once the layout is created as a pattern on the photomask, the photolithographic process utilizes an exposure tool to project the mask pattern onto a layer of photoresist carried on the semiconductor wafer.

A satisfactory product yield is contingent upon having essentially defectless masks and reticles. Photomask deployment may result in relatively high mean time to detect (MTTD) for the appearance of new mask-related defects or the occurrence of mask degeneration. Poor handling of a photomask may dislodge otherwise innocuous particulates and cause relocation to positions on the photomask that ultimately cause defects in the wafers fabricated using the photomask. In any event, degradation of the photomask may cause yield loss in the integrated circuits fabricated using the photomask.

As an important step associated with the photolithography process, wafer fabricators periodically inspect every photomask after a fixed number of wafer passes to determine the condition of the photomask. Unfortunately, high resolution mask inspection tools, such as CCD imaging systems, are typically only found in mask fabrication shops. Wafer fabricators may have only a limited ability to monitor the photomask condition because of the absence of a high resolution mask inspection tool. In any event, photomask inspection does not provide real-time monitoring of contamination on the photomask, the environment of the photomask, or a physical attribute of the photomask.

Accordingly, there is a need for an improved apparatus capable of providing contamination, environmental, or physical monitoring of a photomask.

SUMMARY OF THE INVENTION

In an embodiment of the invention, an apparatus includes a photomask with a mask field characterized by a pattern of features configured to correspond to features of an integrated circuit and a sensor physically coupled with the photomask. The sensor is configured to monitor an attribute related to the photomask.

In an alternative embodiment, a pellicle is coupled with the photomask. The pellicle may include a transparent membrane and a frame connecting the transparent membrane with the photomask to define an enclosed space isolated from an ambient environment. The sensor may be located inside the enclosed space. Attributes monitored by the sensor may include, but are not limited to, chemical contamination in the ambient environment of the photomask, a temperature change of the ambient environment of the photomask, a temperature change experienced by the photomask, a humidity change of the ambient environment of the photomask, acceleration of the photomask, shock experienced by the photomask, vibration of the photomask, optical flux through the photomask, electrostatic discharge environment of the photomask, particulates in the ambient environment of the photomask, and a pressure of the ambient environment of the photomask. Additional sensors may be provided for the purpose of real-time contamination, environmental, or physical monitoring of multiple attributes of the photomask.

DETAILED DESCRIPTION

Embodiments of the invention relate to a photomask assembly including a photomask and a sensor physically coupled with the photomask in which the sensor is operative to monitor one or more attributes of the photomask or events that occur related to the photomask of the assembly. In particular, the sensor monitors or detects events related to the photomask assembly in real-time as the photomask of the assembly is used during a manufacturing process to manufacture an integrated circuit chip. The real-time monitored attributes or events may include, but are not limited to, environmental events such as the presence of chemical contamination, temperature changes, humidity changes, optical flux, and pressure changes, physical events such as shocks, accelerations, or vibrations experienced by the photomask during storage, ESD events or environment such as ambient electrical fields, and contamination events such as the presence of foreign material or particulates.

In a representative embodiment, the sensor may be placed in a region of the photomask assembly that is not active. For example, the sensor may be placed outside of a mask field that is projected during lithography onto the wafer. The sensor can communicate over a wired connection, or wirelessly, with a lithography tool or system, reticle holder, reticle storage system, or another control system for the purpose of recording monitored events related to the photomask assembly. In one specific embodiment, the sensor is located inside the ring or frame of a pellicle coupled with the photomask. The frame of the pellicle may be used as antenna for wireless communications with the control system. In yet another embodiment, the sensor may include the capability of storing an identification number and communicating that identification number associated with the photomask to the control system for use in distinguishing among different photomasks.

Figure 1:
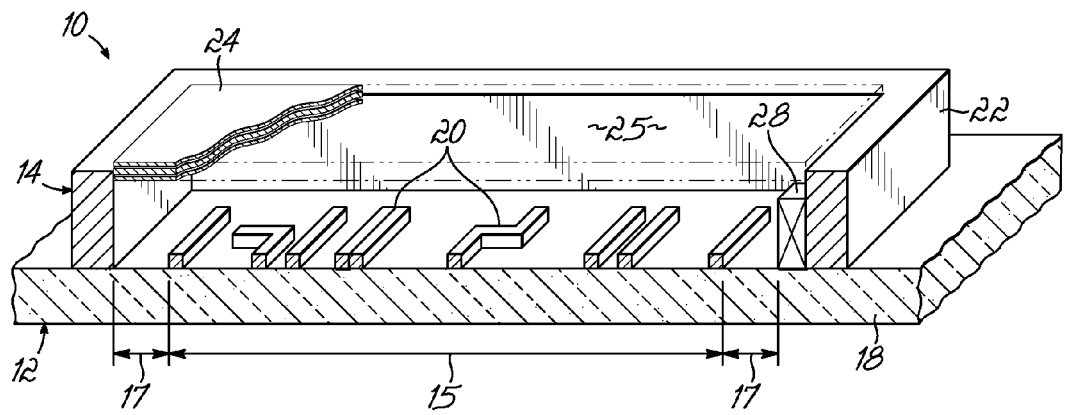
FIG. 1 is a side view of a photomask assembly including a pellicle, a photomask, and a sensor in accordance with an embodiment of the invention.
Figure 2:
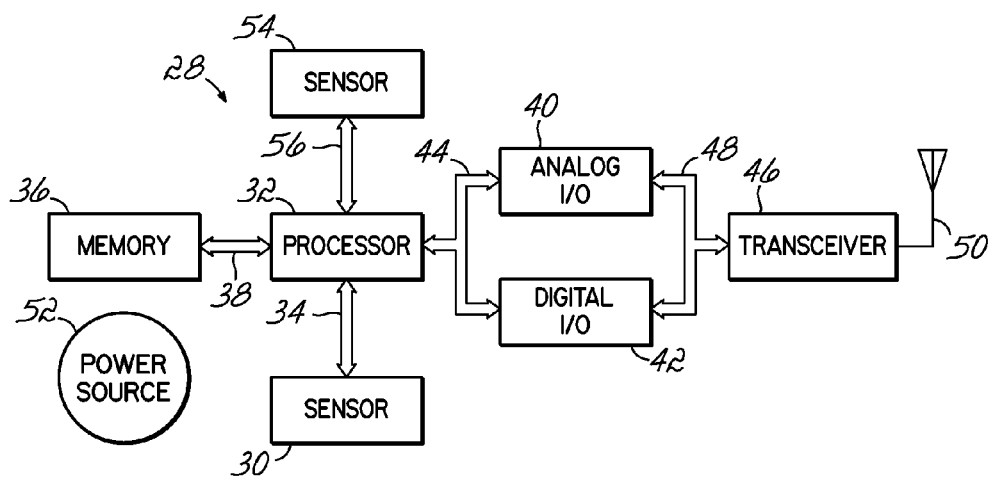
FIG. 2 is a diagrammatic view of the sensor of FIG. 1.

With reference to FIG. 1, a photomask assembly 10 is configured to be coupled with an optical aligner, such as a stepping projection aligner or stepper, and used in conjunction with a lithography exposure system in a chip manufacturing line to generate a portion of a pattern for an integrated circuit in a photoresist layer applied to a wafer. To transfer the integrated circuit pattern portion onto the photoresist layer, the photomask assembly 10 is suspended above the wafer and a flux of ultra-violet light, X-rays, or other type of electromagnetic radiation is directed from the lithography exposure system through the photomask assembly 10 and toward the wafer.

The photomask assembly 10 includes a photomask 12 and a pellicle 14. The photomask 12 includes a substantially flat substrate or plate 18 of a material like quartz or glass and a layer 20 of a material, such as chromium or chromium oxynitride, applied on one side. The layer 20 is etched, stopping on the plate 18, to impart a pattern of opaque and non-opaque regions on the plate 18. The opaque regions and non-opaque regions of layer 20 correspond to a pattern representing structural features in an integrated circuit design.

An image of the opaque and non-opaque regions in the metal layer 20 is projected onto a layer of photoresist carried on the semiconductor wafer by directing the electromagnetic radiation through the photomask 12 and toward the wafer. The photomask 12 includes an active area in the form of a mask field 15 containing the opaque and non-opaque regions that are imaged onto the photoresist layer of the wafer. The photomask 12 may incorporate a pattern large enough to pattern an entire wafer with each exposure or, alternatively, may function as a reticle containing a pattern for one or more die but not large enough to transfer a wafer-sized pattern in a single exposure.

Non-opaque regions permit electromagnetic radiation of the wavelength used by the exposure system using the photomask 12 to be transmitted through the plate 18 un-attenuated to a degree sufficient to expose the photoresist. Opaque regions attenuate or completely block electromagnetic radiation of the wavelength used by the exposure system to a degree that the photoresist is not exposed. Alternatively, the photomask 12 may include regions of modulated thickness that effectively define the opaque and non-opaque regions that are imaged with phase shifting onto the photoresist layer.

The pellicle 14 is constructed of a pellicle frame 22 and a thin transparent film or membrane 24 secured peripherally to the frame 22. The photomask 12 further includes a non-active area in the form of an annular border 17 that is spatially located between the frame 22 of the pellicle 14 and the mask field 15 and that is not imaged onto the photoresist layer on the wafer. The frame 22 is physically affixed or attached to the photomask 12 such that one surface of the transparent membrane 24 is held at a fixed distance from the confronting surface of the photomask 12. The frame 22, which is typically a continuous and unbroken ring, may be adhesively bonded to the periphery of the photomask 12 to affix the pellicle 14 to the photomask 12. The frame 22 may be a single-thickness wall composed of a hard plastic or, alternatively, a metal such as aluminum or an aluminum alloy. The transparent membrane 24 may be composed of an organic material, such as nitrocellulose or cellulose acetate, and may be fluoropolymer coated.

The pellicle 14 operates to isolate a self-contained, controlled environment consisting of an enclosed space 25 bordered or bounded spatially by the frame 22, the transparent membrane 24, and photomask 12. The attribute that is controlled within the controlled environment of the enclosed space 25 may comprise one or more of temperature, humidity, chemical composition of the atmosphere, pressure, particulate count, or combinations of these attributes. The pellicle 14 primarily functions to shield the photomask 12 against contamination originating from the cleanroom environment. The image of any foreign matter or contamination collected on the transparent membrane 24 is not reproduced in the photosensitive resist layer residing on the wafer because the separation between the transparent membrane 24 and photomask 12 places any collected contamination at a location that, during exposure, is projected in an out of focus condition in the plane of the wafer.

In an alternative embodiment of the invention, the pellicle 14 may be omitted from the photomask 12. Certain types of photomasks 12 may not require the protection afforded by a pellicle 14, such as photomasks 12 that are used in conjunction with X-rays originating from the lithography exposure system.

The photomask assembly 10 further includes an electronics package 28 with a sensor 30, a processor 32, a bus 34 connecting the processor 32 to the sensor 30, a memory 36, and a bus 38 connecting the processor 32 to the memory 36. The electronics package 28 further includes an analog I/O circuit 40 and a digital I/O circuit 42 that are both connected to processor 32 by a bus 44. The electronics package 28 further includes a transceiver 46 that is connected by a bus 48 to the analog I/O circuit 40 and digital I/O circuit 42 and, thereby, by bus 44 with the processor 32.

Transceiver 46 has an antenna 50 used by the electronics package 28 to transmit sensor readings to a remote control system (not shown). The transceiver 46 may also rely on the antenna 50 to receive programming or control signals, such as power on, power off, schedule sensor operation, communicate sensor data, and poll. In certain alternative embodiments, the transceiver 46 can be replaced with a transmitter that lacks signal-receiving capabilities. The sensor readings, as well as any programming or control signals, may be transmitted and received according to any suitable encoding and modulating scheme. In one embodiment, the antenna 50 may comprise the frame 22 of the pellicle 14, which is an existing physical structure of the photomask assembly 10, so that an additional discrete antenna structure is not required. The connection between the pellicle frame 22 and the analog I/O circuit 40 and digital I/O circuit 42 are established in a manner understood by a person having ordinary skill in the art. In an alternative embodiment, the transceiver 46 may be omitted in its entirety, and replaced by a wired connection with the control system.

The electronics package 28 is powered by a power source 52, which may be a rechargeable and/or replaceable battery. In other embodiments, the power source 52 may be solar cell that is stationed in the electronics package 28 and positioned relative to the pellicle 14 at a location that is illuminated by the electromagnetic energy directed through the photomask 12. Such power sources 52 have conventional constructions understood by a person having ordinary skill in the art.

The electronics package 28 and, therefore, the sensor 30 are physically coupled with the photomask 12, the pellicle 14, or both by, for example, one or more adhesive bonds. In the representative embodiment, the electronics package 28 is directly physically attached to the photomask 12 at a location inside the perimeter established by the frame 22 of the pellicle 14 and within the enclosed space 25. However, the electronics package 28 is located in the annular border 17 of the photomask 12 such that the electronics package 28 does not occlude the transmission of electromagnetic energy through the mask field 15 of the photomask 12. In other words, the electronics package 28 has a footprint on the photomask 12 that is confined within the annular border 17. In an alternative embodiment, the electronics package 28 may have a direct, physically coupling with the frame 22 of the pellicle 14, instead of the photomask 12, such that the frame 22 is an intervening structure that facilitates an indirect, physical coupling between the electronics package 28 and the photomask 12.

The sensor 30 may have a construction, as understood by a person having ordinary skill in the art, imparting the capability of detecting one or more contamination, environmental, or physical attributes related to the photomask 12 in real-time as the photomask 12 is used during a manufacturing process to manufacture an integrated circuit chip. The attributes monitored by sensor 30 may include, but are not limited to, the presence of chemical contamination in the atmosphere inside the enclosed space 25, the temperature of the atmosphere inside the enclosed space 25, a temperature of the photomask 12, a humidity inside the enclosed space 25, accelerations, shocks, or vibrations experienced by the photomask 12 during handling and storage, an optical flux through the photomask 12, electrostatic discharge (ESD) events or environment such as ambient electrical fields near the photomask 12, the presence of foreign material or particulates inside the enclosed space 25, and pressure inside the enclosed space 25. If the pellicle 14 is omitted from the construction, then monitored attribute is not tied to the enclosed space 25 so that, in this instance, the sensor 30 may sense the presence of chemical contamination in the ambient environment near the photomask 12, a temperature of the ambient environment near the photomask 12, a temperature of the photomask 12, a humidity of the ambient environment near the photomask 12, accelerations, shocks, or vibrations experienced by the photomask 12 during handling or storage, an optical flux through the photomask 12, electrostatic discharge (ESD) events or environment such as electrical fields near the photomask 12, the presence of foreign material or particulates in the vicinity of the photomask 12, and the pressure of the ambient environment near the photomask 12.

In one embodiment, the sensor 30 may be a chemical transducer configured to sense the presence of elemental gases like oxygen, hydrogen, or chlorine, ammonia, water, hydrogen fluoride, hydrogen chloride, nitrogen oxides, silanes, alcohols, ketones, esters, amines, solvents, chlorinated solvents, or fluoridated solvents. The sensor 30 may be capable of monitoring the concentration of one or more chemical contaminants in the ambient environment.

In another embodiment, the sensor 30 may be a thermistor or thermocouple capable of outputting a signal from which temperature readings can be deduced and temperature changes can be detected. In other embodiments, the sensor 30 may comprise an accelerometer configured for measuring accelerations, shocks, or vibrations of the photomask 12 imparted during handling or storage, a humidity transducer configured for monitoring relative humidity, or a pressure transducer for sensing the pressure level of the gases in the surrounding atmosphere. In yet another embodiment, the sensor 30 may comprise a photoelectric type particulate sensor or an ionization type particulate sensor that is configured to monitor for the presence of particulates or other foreign matter. The processor 32 includes any circuitry required to operate the sensor 30 or additional circuitry may be included in the electronics package 28. A portion of the circuitry may also be carried on board the sensor 30.

The sensor 30 generates sensor data representing the measured attribute. The electronics package 28 may continuously communicate the sensor data in real time to a control system, may communicate real-time sensor data periodically to a control system, may store the sensor data and communicate the stored data periodically to a control system, or may communicate stored sensor data to a control system only when polled by an external source. For example, the electronics package 28 may store sensor data over time that may be useful, when communicated using transceiver 46 and antenna 50, in diagnosing a source of contaminants. As another example, use or inspection decisions may be keyed off the sensor data by storage area. The electronics package 28 may also be configured to communicate an identification (ID) code in response to a poll signal or other query from an external source. The electronics package 28 may have the ability to communicate data from multiple sensors either in a coded data stream or on several frequencies at the same time.

The sensor readings, as well as any control signals and any ID code, may be stored in the memory 36 on board the electronics package 28.

In an alternative embodiment, the electronics package 28 may include another sensor 54 that is similar in function and construction to sensor 30. A bus 56 connects the sensor 54 with the processor 32. In one embodiment, sensor 54 may be configured to monitor a different attribute related to the photomask 12 than sensor 30. Furthermore, an additional electronics package (not shown) like electronics package 28 may be provided and carry the sensor 54. As may be appreciated, more than two sensors may be incorporated into the electronics package 28 and, in one embodiment, each of these sensors may be configured to sense different attributes of the photomask 12. The additional sensors, such as sensor 54, function to increase the event and attribute monitoring capability of the electronics package 28.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. An apparatus comprising:
    a photomask including a mask field with a pattern of features configured to correspond to features of an integrated circuit;
    a pellicle coupled with the photomask, the pellicle including a transparent membrane and a frame connecting the transparent membrane with the photomask to define an enclosed space isolated from an ambient environment; and
    an electronics package physically coupled with the photomask and located inside the enclosed space, the electronics package including a sensor configured to monitor an attribute related to the photomask and to generate signals related to the attribute, a transceiver, and a processor coupled with the sensor and coupled with the transceiver, the processor is configured to use the transceiver to transmit the signals to a control system, and the frame is coupled with the transceiver so as to operate as an antenna for transmitting the signals.

2. The apparatus of claim 1 wherein the attribute is chemical contamination inside the enclosed space, a temperature of an atmosphere inside the enclosed space, a temperature of the photomask, a humidity inside the enclosed space, accelerations, shocks, or vibrations experienced by the photomask, an optical flux through the photomask, electrostatic discharge events near the photomask, electrostatic discharge environment near the photomask, particulates inside the enclosed space, or pressure inside the enclosed space.

3. The apparatus of claim 1 wherein the processor is programmable with an identification code, and the processor is configured to transmit the identification code.

4. The apparatus of claim 1 further comprising:
    another sensor coupled with the photomask and configured to monitor a different attribute of the photomask.

* * * * *